United States Patent [19]
Hirano et al.

[11] Patent Number: 5,920,509
[45] Date of Patent: Jul. 6, 1999

[54] NONVOLATILE SEMICONDUCTOR MEMORY DEVICE CAPABLE OF CONDITIONING OVER-ERASED MEMORY CELLS

[75] Inventors: Hiroshige Hirano; Toshiyuki Honda, both of Nara, Japan

[73] Assignee: Matsushita Electric Industrial Co., Ltd., Osaka, Japan

[21] Appl. No.: 08/888,307

[22] Filed: Jul. 3, 1997

Related U.S. Application Data

[62] Division of application No. 08/690,790, Aug. 1, 1996, Pat. No. 5,831,904.

[30] Foreign Application Priority Data

Aug. 2, 1995 [JP] Japan .................................. 7-197352

[51] Int. Cl.⁶ .................................................. G11C 16/06
[52] U.S. Cl. ............................... 365/185.24; 365/185.13; 365/185.33; 365/185.23
[58] Field of Search ........................ 365/185.24, 185.13, 365/185.3, 185.33, 185.23

[56] References Cited

U.S. PATENT DOCUMENTS

| | | | |
|---|---|---|---|
| 5,233,562 | 8/1993 | Ong et al. | 365/185.3 |
| 5,388,069 | 2/1995 | Kokubo | 365/185.3 |
| 5,422,846 | 6/1995 | Chang et al. | 365/185.12 |
| 5,546,340 | 8/1996 | Hu et al. | 365/185.3 |
| 5,568,419 | 10/1996 | Atsumi et al. | 365/185.3 |
| 5,576,991 | 11/1996 | Radjy et al. | 365/185.24 |
| 5,608,672 | 3/1997 | Tang et al. | 365/185.3 |

FOREIGN PATENT DOCUMENTS

| | | |
|---|---|---|
| 6-162787 | 6/1994 | Japan . |
| 6-349288 | 12/1994 | Japan . |

OTHER PUBLICATIONS

Communication from European Patent Office and attached Search Report, Aug. 25, 1998.

*Primary Examiner*—David Nelms
*Assistant Examiner*—Andrew Q. Tran
*Attorney, Agent, or Firm*—Merchant, Gould, Smith, Edell, Welter & Schmidt, P.A.

[57] ABSTRACT

By setting full group reversal control gates to a logical voltage "H", memory cells on all bit lines of a memory cell array block are connected to a reversal voltage supply circuit so that a group reversal operation is performed. When one of the group reversal control gates is set to the logical voltage "H", the memory cells on the bit lines having either even or odd numbers of the memory cell array block are connected to the reversal voltage supply circuit so that a partial group reversal operation is performed. When one of column selection gates is set to the logical voltage "H", the selected bit line is connected to the reversal voltage supply circuit. Consequently, a line reversal operation for the memory cell connected to the selected bit line is performed. Thus, the high-speed reversal operation which fully controls the offleak current of the memory cell can be implemented and the low-voltage operation can be realized by changing the operation unit for performing the reversal operation.

3 Claims, 19 Drawing Sheets

NONVOLATILE SEMICONDUCTOR MEMORY DEVICE CAPABLE OF CONDITIONING OVER-ERASED MEMORY CELLS

This is a Divisional of application Ser. No. 08/690,790, filed Aug. 1, 1996, now U.S. Pat. No. 5,831,904, which application(s) are incorporated herein by reference.

BACKGROUND OF THE INVENTION

The present invention relates to a semiconductor memory device, and more particularly to a flash memory. The flash memory can rewrite information by electric erasing and writing. Memory cells can be formed by a transistor. All memory cells or memory cell blocks can be electrically erased in a group. In the flash memory, the time for rewriting data can be shortened by the group erasing function.

FIGS. 13 to 16 show the sectional structure of the flash memory in each operating state, wherein a field effect transistor having a two-layer gate structure, which is formed on a P type silicon substrate SUB, is shown as the flash memory. The field effect transistor has a floating gate FG, a control gate CG, a source S and a drain D.

Information is written to the memory cell by injecting hot electrons generated in the vicinity of the drain into the floating gate FG to increase the threshold as shown in FIG. 13. In this case, the control gate CG has a potential of 6 V, the drain D has a potential of 5 V, and the source S and the substrate SUB have a potential of 0 V. The memory cell is erased by drawing charges from the floating gate FG to the source S to decrease the threshold by a FN (Fowler Nordhein) tunnel current as shown in FIG. 14. In this case, the control gate CG and the substrate SUB have a ground potential of 0 V, the drain D is open and the source S has a potential of 12 V. When the erasing operation has been applied for a long time, the memory cell is brought into the overerase state. Even though the potential of the control gate CG is set to 0 V, the memory cell transistor keeps the ON state.

A reversal operation to be described below can eliminate the overerase state. As shown in FIG. 15, the reversal of the memory cell is performed by injecting the hot electrons generated in the vicinity of the drain into the floating gate FG to increase the threshold in the same manner as writing. In this case, the control gate CG has a potential of 0 V, the drain D has a potential of 5 V, and the source S and the substrate SUB have a potential of 0 V.

First of all, the memory cell is in the overerase state. Consequently, a current flows in the ON state even though the control gate CG has a potential of 0 V. When the hot electrons generated in the vicinity of the drain D are injected into the floating gate FG, the threshold gradually approaches 0 V from a negative voltage. When the threshold reaches about 0 V, the current stops flowing to the memory cell and the hot electrons are not generated. For this reason, the threshold does not exceed 0 V. Thus, the overerase state is eliminated.

The memory cell is read out by setting the control gate CG to 5 V, the source S and the substrate SUB to a ground potential 0 V, and the drain D to 1 V as shown in FIG. 16. It is decided whether data is 0 or 1 depending on the current flow from the drain to the memory cell. When negative charges are accumulated in the floating gate FG, the current does not flow to the memory cell. In this case, the data is set to 0. When the negative charges are not accumulated in the floating gate FG, the current flows to the memory cell. In this case, the data is set to 1.

In the prior art, the reversal of the memory cell is carried out to eliminate the overerase state. In the read state, it is possible to increase a difference between the ON current which flows to the memory cell in the erase state and the offleak current which flows to the memory cell in the write state.

FIG. 17 shows the threshold of a memory cell transistor based on the above-mentioned operation. FIG. 18 shows the relationship between the time for the reversal operation and the offleak current of the memory cell. As is apparent from FIG. 18, the offleak current of the memory cell is decreased when the time for the reversal operation is increased, and is saturated at a certain value.

FIG. 19 shows the structure of a circuit of a memory cell array block BLKn. FIG. 20 shows the circuit structure of a memory device having four memory cell array blocks arranged thereon. FIG. 21 shows the control signal timing of the reversal operation of the whole circuit shown in FIG. 20.

The memory device according to the prior art comprises four memory cell array blocks BLK0 to BLK3. The reversal operation is sequentially performed for each block. A circuit shown in FIG. 19 will be described briefly. WL0 to WL255 designate word lines. BL0 to BL63 designate bit lines. CG0 to CG63 designate column selection gates. DL designates a data line. RVG00 designates a full group reversal control gate. SC00 designates a source control gate. SOU00 designates a common source node. VSS designates a ground voltage. SA designates a sense amplifier circuit. DVS00 designates a reversal voltage supply circuit. Qn designates an N channel MOS transistor. Qm designates a memory cell transistor.

The drains of memory cells on the different word lines are connected to a bit line. The sources of memory cells on the same word line are connected to the comon source node SOU00. The common source node SOU00 is connected to the ground voltage VSS through the N channel MNOS transistor Qn having the source control gate SC00. Each bit line is connected to the reversal voltage supply circuit DVS00 through the N channel MOS transistor Qn having the common full group reversal control gate RVG00.

Each bit line is connected to the data line DL through the N channel MOS transistor Qn having column selection gates CG0 to CG63. The data line DL is connected to the sense amplifier circuit SA. The reversal operation is performed by setting the full group reversal control gate RVG00 to a logical voltage "H" to supply a reversal voltage from the reversal voltage supply circuit DVS00 to the bit lines BL0 to BL63.

As shown in FIG. 21, the full group reversal control gates RVG00 to RVG30 are sequentially set to the logical voltage "H" so that the reversal operation is performed for the memory cell array blocks BLKO to BLK3 shown in FIG. 20. The reversal operation may be simultaneously performed for the whole device by setting the full group reversal control gates RVG00 to RVG30 to the logical voltage "H" at the same time.

The inventors have found that the following problems arise if all the flash memory cells or all the memory cell array blocks are reversed in a group. Specifically, a lot of current flows from the drains of all the memory cells to the sources thereof at once. Consequently, a voltage drop is caused by the resistance components that form the node of the source so that the potential of the source is raised. An increase in the potential of the source reduces the difference in voltage between the drain and source of the memory cell. Consequently, the current flows with difficulty as compared with the case where the potential of the source is not raised. If the current flows with difficulty, hot electrons are not often generated so that the reversal operation is not performed efficiently. In other words, the time for the reversal operation to control the offleak current of the memory cell is increased or the offleak current of the memory cell cannot fully be controlled.

SUMMARY OF THE INVENTION

The present invention provides a semiconductor memory device, comprising a memory cell array having a plurality of flash memory cells arranged in a matrix, the flash memory cells sharing a source, reversal voltage applying means for applying a voltage to drains of the flash memory cells, a divider for dividing a plurality of drains of the flash memory cells into a plurality of groups, and a selector for selecting some groups to which the reversal voltage applying means is connected at the same time.

Furthermore, the present invention provides a method for controlling the semiconductor memory device which comprises a memory cell array having a plurality of flash memory cells arranged in a matrix, the flash memory cells sharing a source, reversal voltage applying means for applying a voltage to drains of the flash memory cells, a divider for dividing a plurality of drains of the flash memory cells into a plurality of groups, and a selector for selecting some groups to which the reversal voltage applying means is connected at the same time, the method comprising the steps of performing the reversal operation a plurality of times, and sequentially decreasing the number of groups selected by the selector. More specifically, the reversal operation is first performed for a lot of groups at the same time to sequentially decrease the number of groups to be selected. For example, the full group reversal operation, the partial group reversal operation and the line reversal operation can fully control the offleak current of the memory cell in a short time.

The present invention provides another semiconductor memory device, comprising a plurality of memory cell arrays having a plurality of flash memory cells arranged in a matrix, the flash memory cells sharing a source, each memory cell array including reversal voltage applying means for applying a voltage to drains of the flash memory cells, a divider for dividing a plurality of drains of the flash memory cells into a plurality of groups, a selector for selecting some groups to which the reversal voltage applying means should be connected at the same time, and a control circuit for simultaneously selecting the selector of the memory cell arrays.

Thus, the respective groups of the memory cell arrays are selected at the same time so that the reversal operation is performed. By performing the reversal operation for each memory cell array block in parallel, the offleak current of the memory cell can be controlled fully without increasing the time for the entire reversal operation, even through the number of the memory cell array blocks is increased.

It is preferable that division into groups in the memory cell array should be performed in such a manner that an increase in source potential is the smallest, irrespective of the selected group.

If the node of the source is a grounding voltage supply of word line driving means for controlling the gate of the flash memory cell, the potential of the word line is raised according to the increase in the source potential. As a result, hot electrons which are generated cause the reversal operation to be performed. Accordingly, the reversal operation can be performed at a high speed and the offleak current of the memory cell can be controlled fully.

The present invention provides yet another semiconductor memory device, comprising a memory cell array in which a plurality of word lines connected to the gates of flash memory cells, a plurality of bit lines connected to the drains of the flash memory cells, and the sources of the flash memory cells that are shared in the direction of the word line are arranged in a matrix, and a source voltage supply, wherein the source shared in the direction of the word line and the source voltage supply are selectively connected by a signal for selecting the word line. By selectively connecting the source shared in the direction of the word line and the source voltage supply by the signal for selecting the word line, the influence of the offleak current of the memory cell on a non-selected word line can be reduced.

It is preferable that the shared source should be selected by a plurality of word lines. Consequently, the influence of the offleak current of the memory cell on the non-selected word line can be reduced with the smaller layout area. Furthermore, it is preferable that the word line should include a first wiring layer that forms the gate of the flash memory cell, and a second wiring layer, the shared source being connected by the second miring layer. For example, the second wiring layer having a low resistance causes the word line signal to be delayed and the source signal line to have a low resistance. Thus, it is possible to reduce the time for the reversal operation and the influence of the offleak current of the memory cell.

DETAILED DESCRIPTION OF THE PREFERRED EMBODIMENTS

Preferred embodiments of the present invention will be described below with reference to the drawings.
(First Embodiment)

Figure 1:
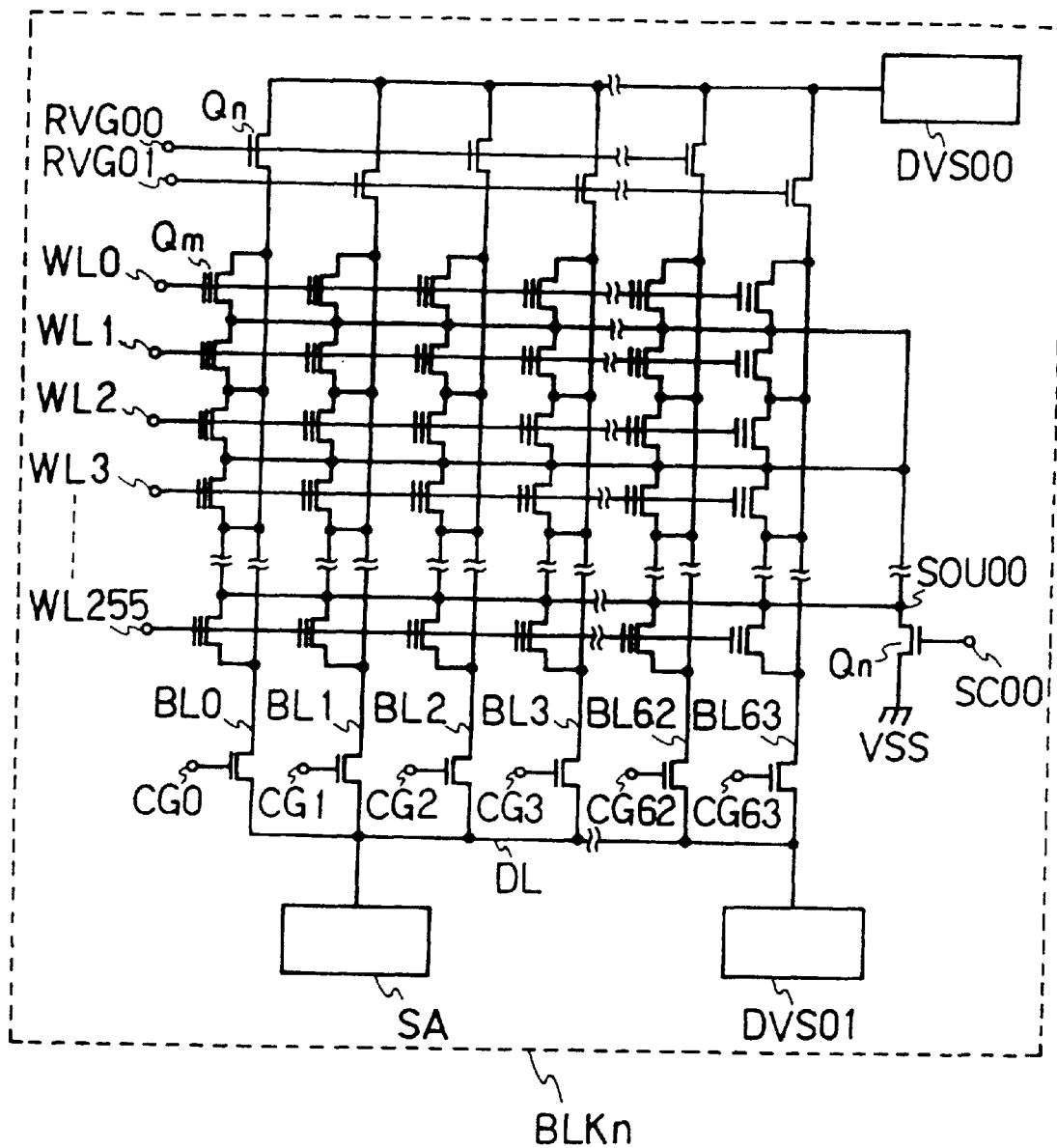
FIG. 1 is a circuit diagram showing a memory cell array of a semiconductor memory device according to a first embodiment of the present invention.
Figure 2:
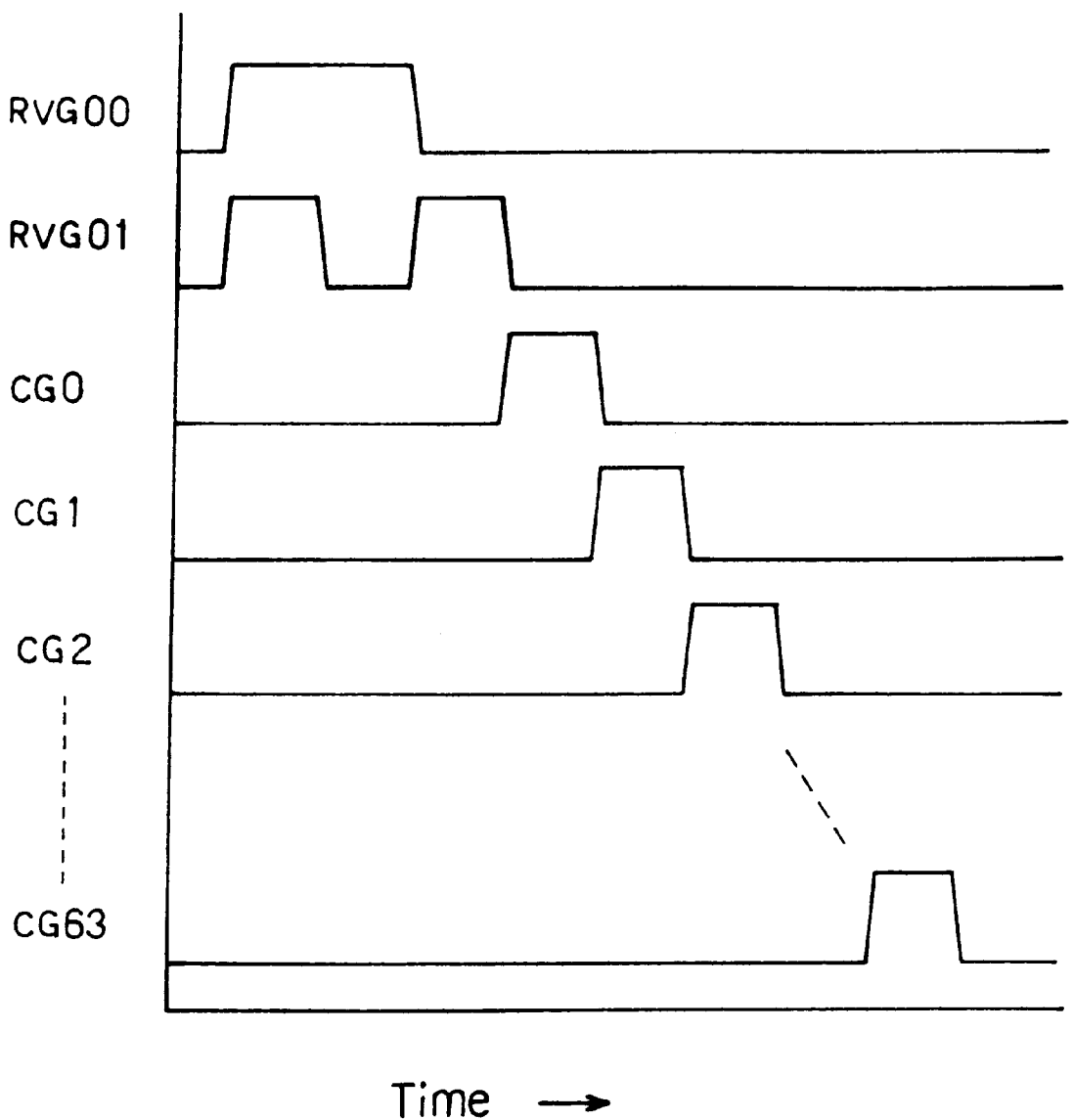
FIG. 2 is a chart showing the operation timing of the semiconductor memory device shown in FIG. 1.
Figure 3:
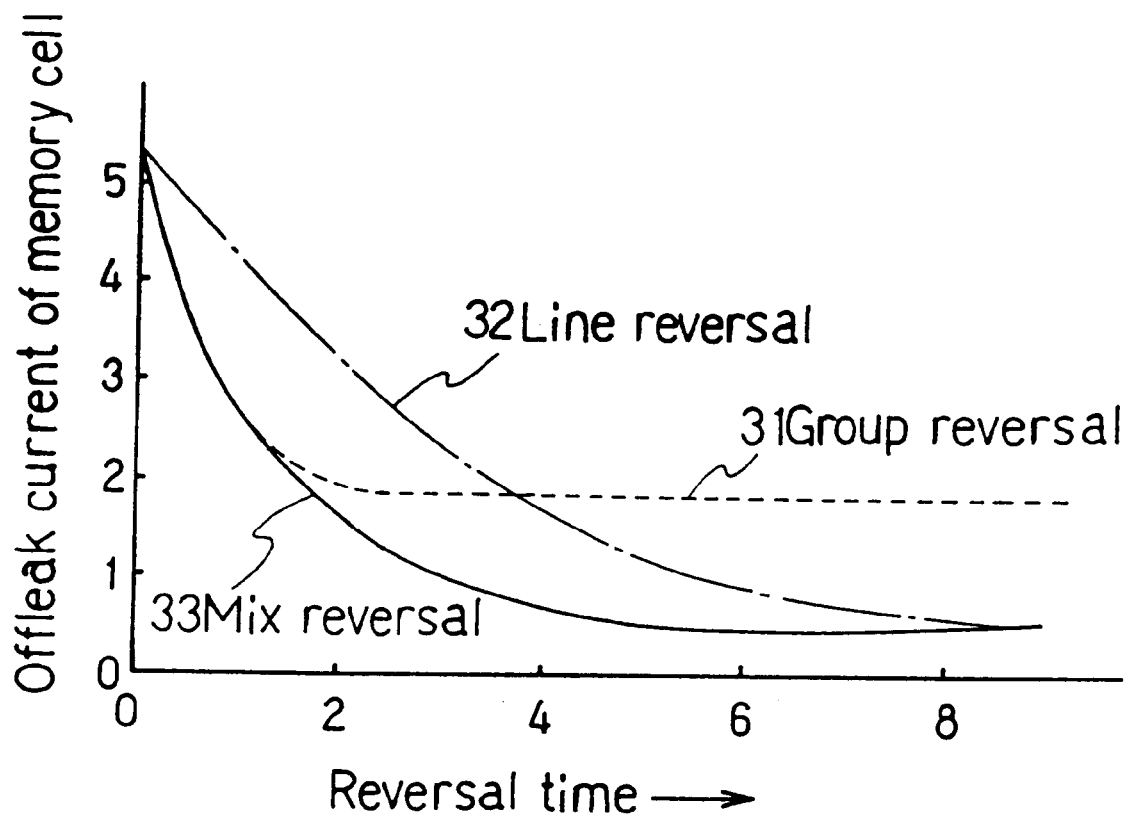
FIG. 3 is a chart showing the relationship between the time for the reversal operation and the offleak current of a memory cell of the semiconductor memory device shown in FIG. 1.

FIG. 1 is a diagram showing the circuit structure of a memory cell array block BLKn. FIG. 2 is a chart showing the control signal timing of the reversal operation of the circuit shown in FIG. 1. FIG. 3 is a chart showing the relationship between the time for the reversal operation and the offleak current of the memory cell.

The circuit diagram of FIG. 1 will be briefly described below. WL0 to WL255 designate word lines. BL0 to BL63 designate bit lines. CG0 to CG63 designate column selection gates. DL designates a data line. RVG00 and RVG01 designate full group reversal control gates. SC00 designates a source control gate. SOU00 designates a common source node. VSS designates a ground voltage. SA designates a sense amplifier circuit. DVS00 and DVS01 designate reversal voltage supply circuits. Qn designates an N channel MOS transistor. Qm designates a memory cell transistor.

The drains of corresponding memory cells on the different word lines are connected to a bit line. The sources of memory cells on the same word line are connected to the comoon source node SOU00. The common source node SOU00 is connected to the ground voltage VSS through the N channel MOS transistor Qn having the source control gate SC00. Each bit line is connected to the reversal voltage supply circuit DVS00 through the N channel MOS transistor Qn having the full group reversal control gate RVG00 or the N channel MOS transistor Qn having the common full group reversal control gate RVG01.

Each bit line is connected to the data line DL through the N channel MOS transistor Qn having column selection gates CG0 to CG63. The data line DL is connected to the sense amplifier circuit SA and the reversal voltage supply circuit DVS01. In the first embodiment, three kinds of reversal operations are performed.

First, the full group reversal control gates RVG00 and RVG01 are set to a logical voltage "H". Consequently, the memory cells on all the bit lines of the memory cell array block BLKN are connected to the reversal voltage supply circuit DVS00 so that the full group reversal operation is performed. Second, only one of the full group reversal control gates RVG00 and RVG01 is set to the logical voltage "H". Consequently, the memory cells on the bit lines having either even or odd numbers of the memory cell array block BLkn are connected to the reversal voltage supply circuit DVS00 so that the partial group reversal operation is performed. Third, by selecting one of the column selection gates CG0 to CG63 to be set to the logical voltage "H", the selected bit line is connected to the reversal voltage supply circuit DVS01. The line reversal operation of the memory cell connected to the bit line is performed.

FIG. 2 is a timing chart in which the above-mentioned three reversal operations, that is, the full group reversal operation, the partial group reversal operation and the line reversal operation are performed in this order. Only the full group reversal operation cannot fully control the offleak current of the memory cell as described as a problem of the prior art (see a curve 31 of FIG. 3). On the other hand, the line reversal operation can fully control the offleak current of the memory cell as shown by curve 32 of FIG. 3. However, it takes a significant time to fully control the initial offleak current of the memory cell because the line reversal operation is performed for each bit line.

In the first embodiment, the above-mentioned three kinds of reversal operations are performed. In other words, the full group reversal operation is first performed at a high speed, the partial group reversal operation is then performed, and the line reversal operation is finally performed. Consequently, high-speed operations can be performed and the offleak current of the memory cell can be controlled fully as shown by curve 33 of FIG. 3.

While the three kinds of reversal operations have been used in the first embodiment, the region of the reversal operation and the like can be changed depending on the reversal characteristics of the device, the size of the memory cell array block, and the source resistance.
(Second Embodiment)

Figure 4:
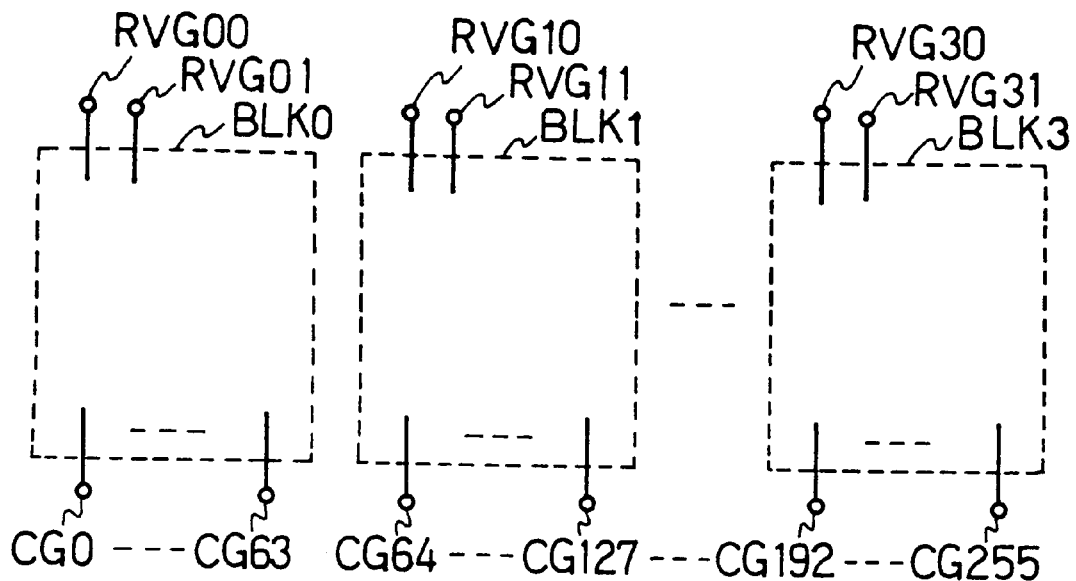
FIG. 4 is a block diagram showing the structure of a memory cell array of a semiconductor memory device according to a second embodiment of the present invention.
Figure 5:
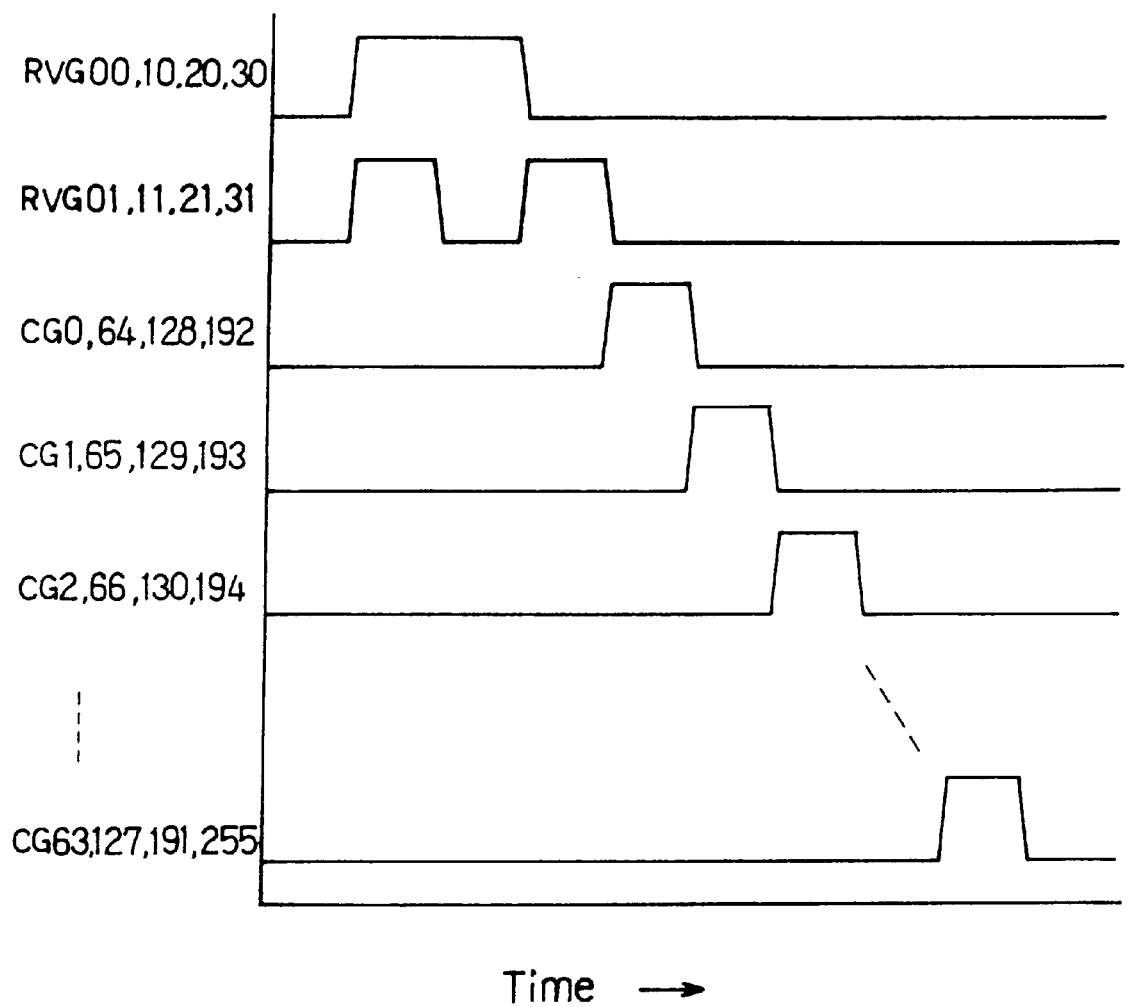
FIG. 5 is chart showing the operation timing of the semiconductor memory device shown in FIG. 4.

FIG. 4 shows the structure of the whole circuit in which the memory cell array blocks BLK0 to BLK3 are provided. FIG. 5 shows the timing of a control signal in the reversal operation of the whole circuit shown in FIG, 4. CG0 to CG255 designate column selection gates, and RVG00 to RVG31 designate full group reversal control gates.

In the operation according to the second embodiment, the operation of a memory cell array block according to the first embodiment is performed for the memory cell array blocks BLK0 to BLK3 in parallel. In the same manner as in the first embodiment, the following three kinds of reversal operations are performed. By setting the full group reversal control gates RVG00, RVG01, RVG10, RVG11, RVG20, RVG21, RVG30 and RVG31 to a logical voltage "H", the full group reversal operation can be performed for the memory cells on all the bit lines of the memory cell array blocks BLK0 to BLK3.

By setting either of the full group reversal control gates RVG00, RVG10, RVG20 and RVG30 and the full group reversal control gates RVG01, RVG11, RVG21 and RVG31 to the logical voltage "H", the full group reversal operation can be performed for the memory cells on the bit lines having either even or odd numbers of the memory cell array blocks BLK0 to BLK3.

By selecting one of each of the column selection gates CG0 to CG63, CG64 to CG127, CG128 to CG191, and CG192 to CG255 to be set to the logical voltage of "H", the line reversal operation can be performed for the memory cell on the selected bit line.

According to the second embodiment, the reversal operation can be performed for each memory cell array block in parallel and the offleak current of the memory cell can be controlled fully without increasing the entire time for the reversal operation even though the number of the memory cell array blocks is increased.

(Third Embodiment)

Figure 6:
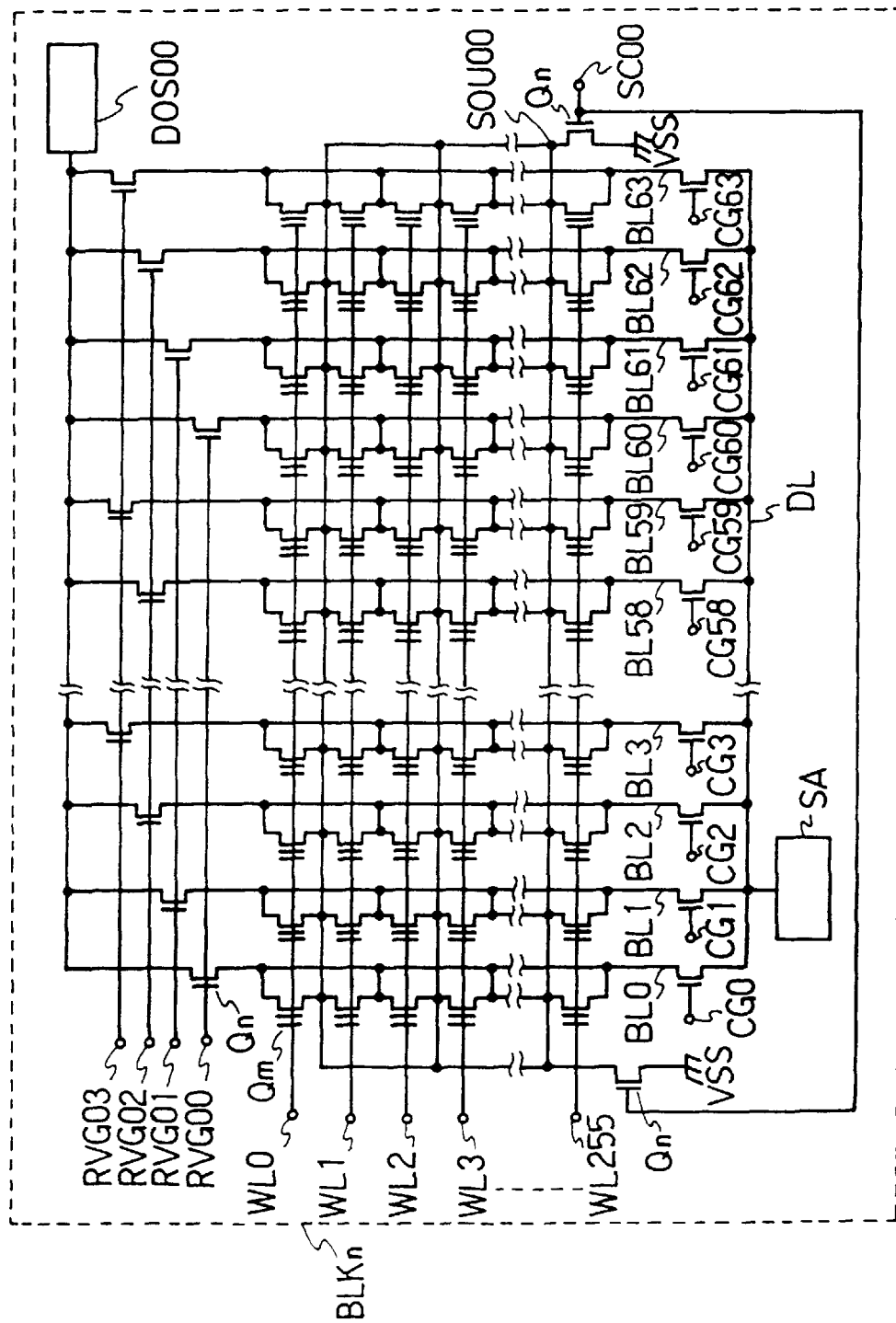
FIG. 6 is a circuit diagram showing a memory cell array of a semiconductor memory device according to a third embodiment of the present invention.
Figure 7:
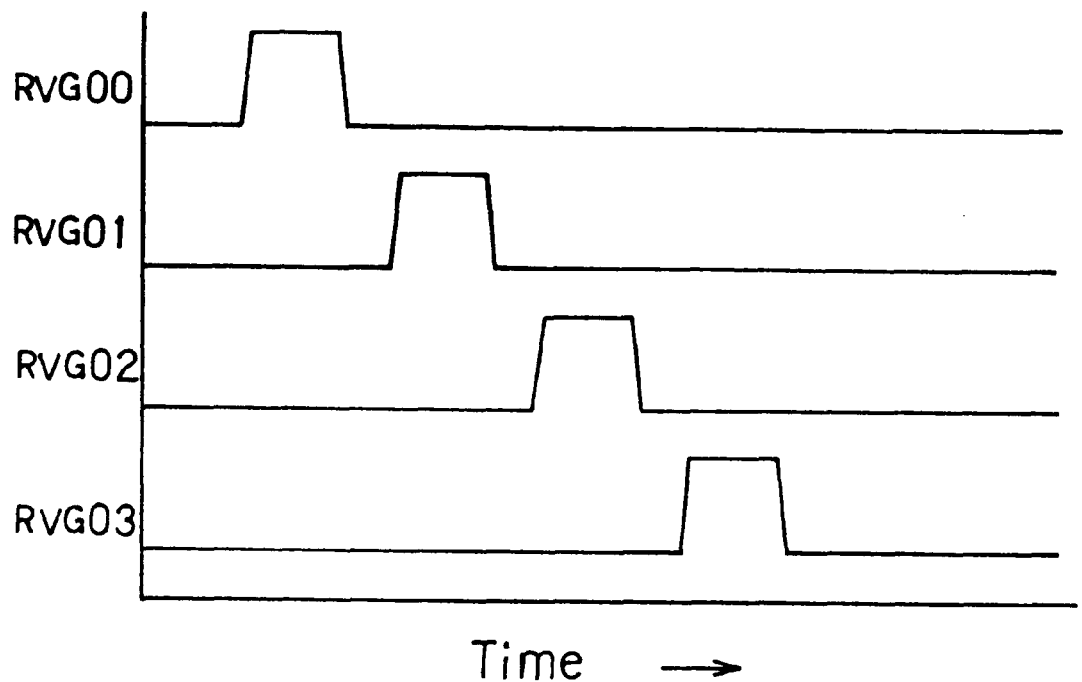
FIG. 7 is a chart showing the operation timing of the semiconductor memory device shown in FIG. 6.

FIG. 6 shows the circuit structure of the memory cell array block BLKn. FIG. 7 shows the control signal timing of the reversal operation of the circuit in FIG. 6.

The circuit diagram of FIG. 6 will be briefly described below. WL0 to WL255 designate word lines. BL0 to BL63 designate bit lines. CG0 to CG63 designate column selection gates. DL designates a data line. RVG00 to RVG03 designate partial group reversal control gates. SC00 designates a source control gate. SOU00 designates a comon source node. VSS designates a ground voltage. SA designates a sense amplifier circuit. DVS00 designates a reversal voltage supply circuit. Qn designates an N channel MOS transistor. Qm designates a memory cell transistor.

The drains of respective memory cells on the different word lines are connected to a bit line. The sources of memory cells on the same word line are connected to the common source node SOU00. The common source node SOU00 is connected, in two places, to the ground voltage VSS through the N channel MOS transistor Qn having the source control gate SC00. Every four bit lines are connected to the reversal voltage supply circuit DVS00 through the N channel MS transistor Qn having the common partial group reversal control gates RVG00 to RVG03. Each bit line is connected to the data line DL through the N channel MOS transistor Qn having column selection gates CG0 to CG63, and the data line DL is connected to the sense amplifier circuit SA.

The reversal operation according to the third embodiment is performed by setting all the partial group reversal control gates RVG00 to RVG03 to a logical voltage "H" in the same manner as in the first embodiment. The memory cells on all the bit lines of the memory cell array block BLKn are connected to the reversal voltage supply circuit DVS00 so that the full group reversal operation is performed. By selectively setting a part of the partial group reversal control gates RVG00 to RVG03 to the logical voltage "H", memory cells on a quarter, half or three fourths of the bit lines of the memory cell array block BLKn are connected to the reversal voltage supply circuit DVS00 so that the partial group reversal operation is performed.

FIG. 7 shows the timing of the partial group reversal operation. The partial group reversal control gates RVG00 to RVG03 are sequentially set to the logical voltage "H" so that the reversal operation is performed for every quarter of memory cell array block BLKn.

In the third embodiment, every four bit lines controlled by the same control gate are uniformly formed. For example, if the only the partial group reversal control gate RVG00 is set to the logical voltage "H", a current flows to the ground voltage VSS portion through the common source node SOU00 because the common source node SOU00 has a parasitic resistance. As a result, the source of the memory cell which is farther from the ground voltage VSS and has a greater parasitic resistance of the common source node SOU00 has a greater increase in potential. More specifically, the source of the memory cell on the bit line BL32 has the greatest increase in potential.

Due to an increase in the source potential, the reversal operation cannot be performed quickly and the offleak current of the memory cell cannot be controlled fully. The bit lines where the reversal operation is performed are provided uniformly in such a manner that the maximum values of the increase in the source potential are almost equal to one another even though any of the partial group reversal control gates RVG00 to RVG03 is selected. The arrangement of the bit lines in which the maximum values of the increase in the source potential are almost equal to one another is not restricted to the arrangement of the third embodiment. As in the first embodiment, it is possible to connect the reversal voltage supply circuit to the data line DL so as to be also used for the line reversal operation for selecting the column selection gates CG0 to CG63.

With the structure of the arrangement of the bit lines according to the third embodiment, the partial group reversal operation can be performed more quickly and the offleak current of the memory cell can fully be controlled.

(Fourth Embodiment)

Figure 8:
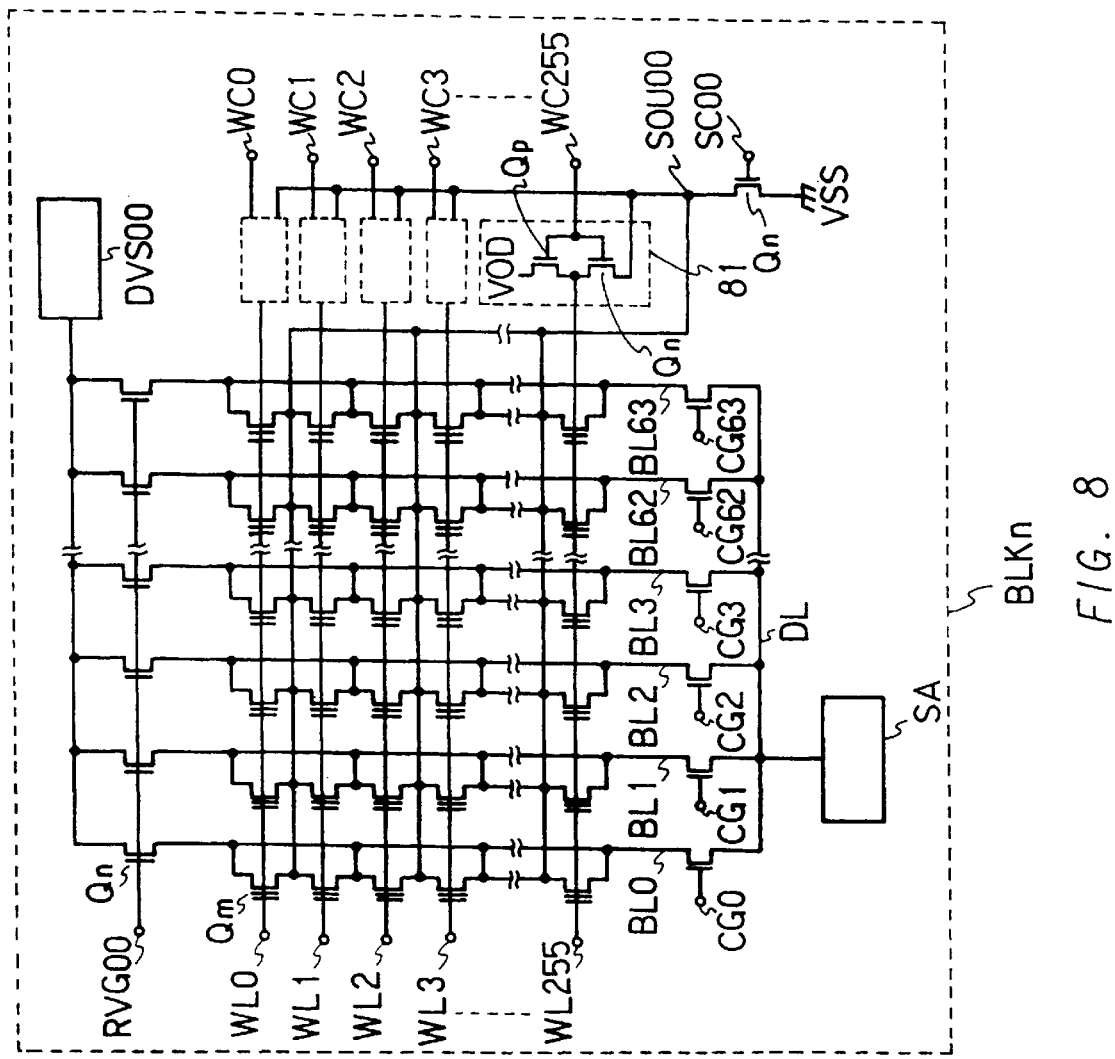
FIG. 8 is a circuit diagram showing a memory cell array of a semiconductor memory device according to a fourth embodiment of the present invention.
Figure 9:
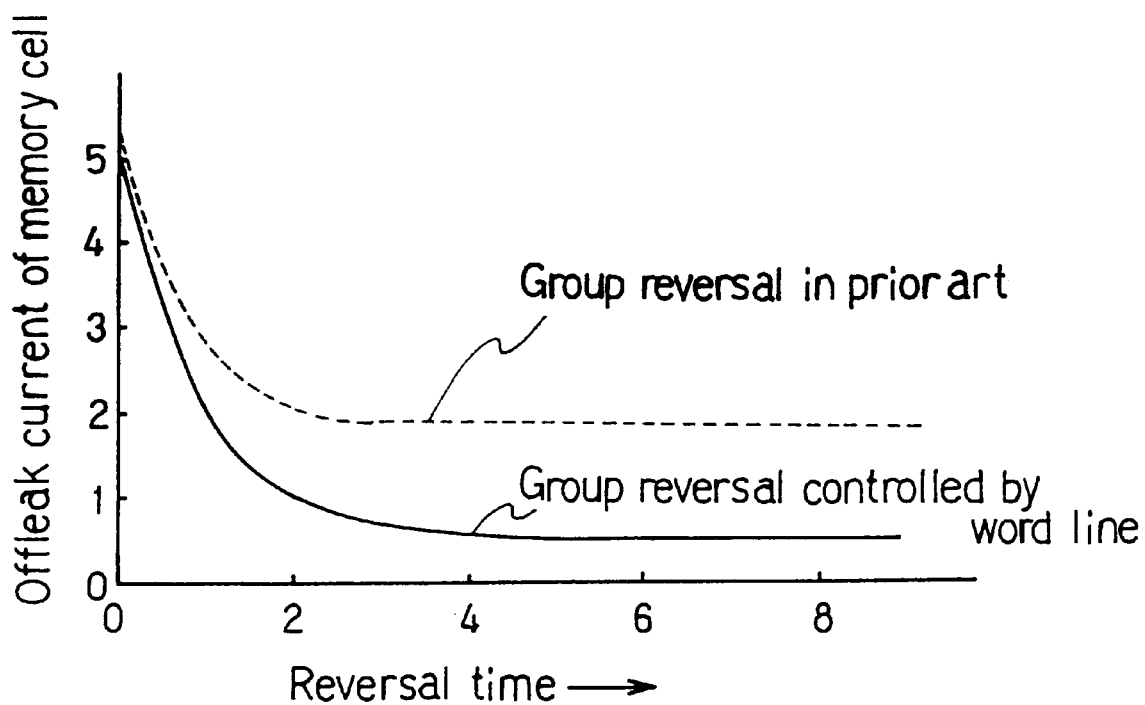
FIG. 9 is a chart showing the operation timing of the semiconductor memory device shown in FIG. 8.
Figure 10:
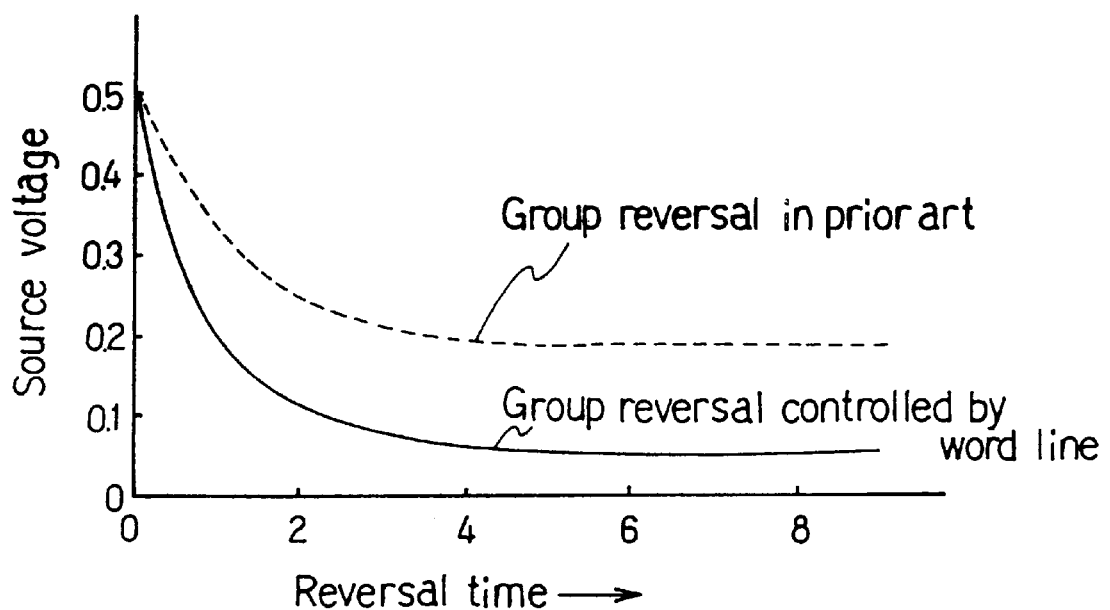
FIG. 10 is a chart showing the relationship between the time for the reversal operation and the source voltage of a memory cell of the semiconductor memory device shown in FIG. 8.

FIG. 8 shows the circuit structure of a memory cell array block BLKn. FIG. 9 shows the relationship between the time for the reversal operation and the offleak current of a memory cell. FIG. 10 shows the relationship between the time for the reversal operation and a source voltage.

The circuit diagram of FIG. 8 will be briefly described below. WL0 to WL255 designate word lines. BL0 to BL63 designate bit lines. CG0 to CG63 designate column selection gates. DL designates a data line. RVG00 designates a full group reversal control gate. SC00 designates a source control gate. SOU00 designates a common source node. VSS designates a ground voltage. SA designates a sense amplifier circuit. DVS00 and DVS01 designate reversal voltage supply circuits. Qn designates an N channel MOS transistor. Qm designates a memory cell transistor.

The drains of memory cells on the different word lines are connected to a bit line. The sources of memory cells on the same word line are connected to the common source node SOU00. The common source node SOU00 is connected to the ground voltage VSS through the N channel MOS transistor Qn having the source control gate SC00. Each bit line is connected to the reversal voltage supply circuit DVS00 through the N channel MOS transistor Qn having the common full group reversal control gate RVG00 or the N channel MOS transistor Qn having the common full group reversal control gate RVG01.

Each bit line is connected to the data line DL through the N channel MOS transistor Qn having column selection gates CG0 to CG63. The data line DL is connected to the sense amplifier circuit SA. A word line driving circuit 81 comprises an N channel MOS transistor Qn and a P channel MOS transistor Qp in which the control signals WC0 to WC255 are gate signals. The source of the N channel MOS transistor Qn is connected to the common source node SOU00 as a ground voltage supply. The reversal operation is performed in the same manner as in the first embodiment.

In the fourth embodiment, the ground voltage supply of the word line driving circuit 81 is connected to the common source node SOU00. According to such a structure, if the potential of the source is raised by the reversal operation, the potential of the word line is also raised according to an increase in the potential of the source so that a current easily flows to the memory cell. At this time, hot electrons are generated. The hot electrons cause the reversal operation to be performed easily.

When the reversal operation proceeds, the current flows to the memory cell with difficulty. Consequently, the increase in the potential of the source is reduced so that the potential of the word line is set to the ground voltage. In other words, the reversal operation can be performed more quickly and the offleak current of the memory cell can be controlled fully. FIG. 9 shows the relationship between the reversal time and the offleak current of the memory cell according to the present embodiment as compared with the prior art. FIG. 10 shows the relationship between the reversal time and the source voltage in the same manner as in FIG. 9.

(Fifth Embodiment)

Figure 11:
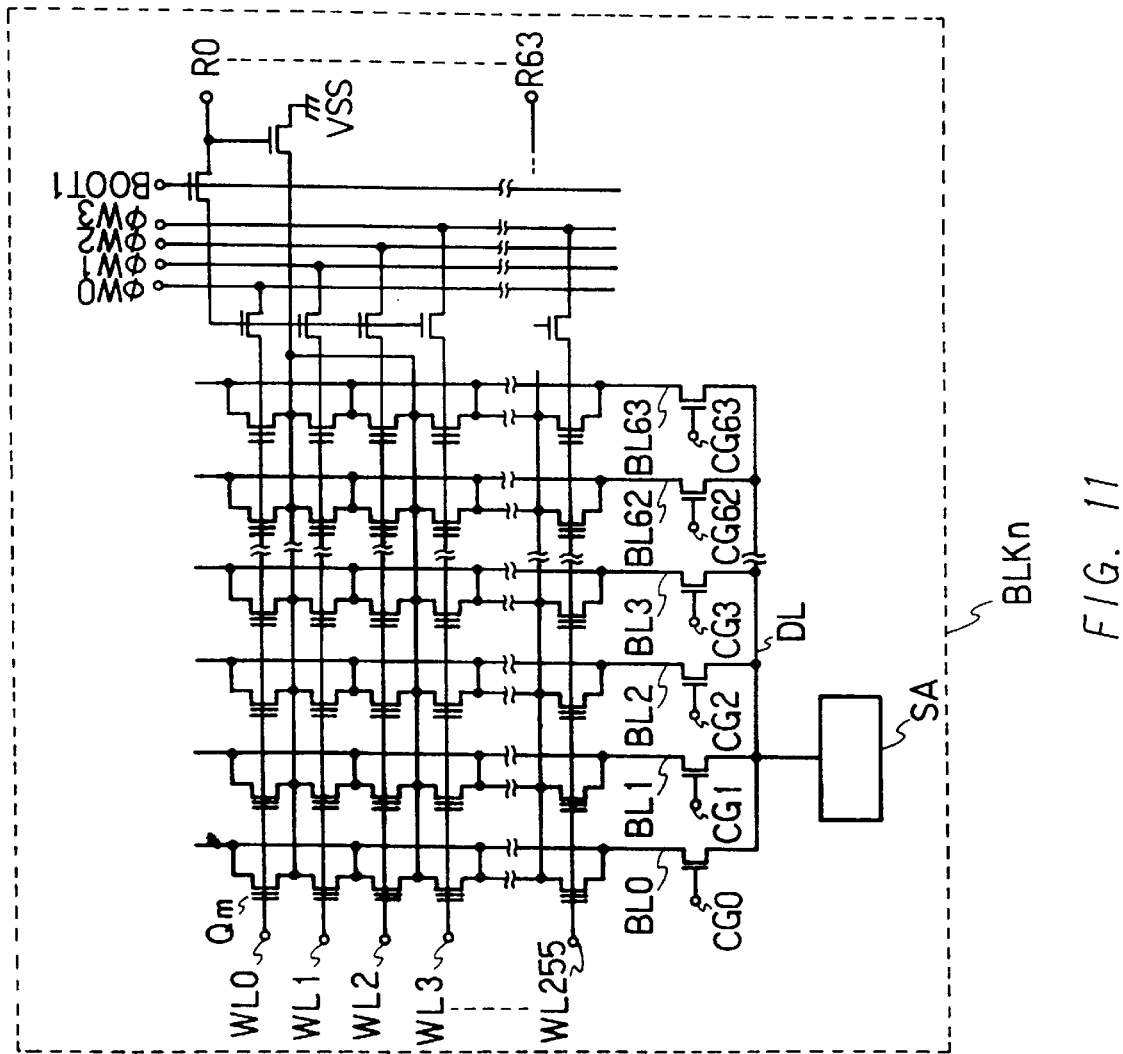
FIG. 11 is a circuit diagram showing a memory cell array of a semiconductor memory device according to a fifth embodiment of the present invention.

The whole circuit structure shown in FIG. 11 is almost the same as in the first embodiment. In the fifth embodiment, a source shared in the direction of a word line and a source voltage supply are selectively connected by a signal for selecting the word line. Consequently, the influence of the offleak current of the memory cell on a non-selective word line can be reduced. Furthermore, the shared source is selected by a plurality of word lines so that the layout area is reduced and the word line and the source are connected by a wiring layer having a low resistance.

In the circuit shown in FIG. 11, R0 to R63 designate low selection signals, Φ W0 to Φ W3 designate low boost selection signals. In the layout shown in FIG. 12, 1 designates an element isolation region, 2 designates a word line that forms the control gate of a memory cell transistor, 3 designates a first aluminum wiring layer that forms a bit line and the like, 4 designates a second aluminum wiring layer that forms the word line, 4B designates a wiring layer that forms a source line and is the same as the aluminum wiring layer 4, 5 designates a contact for the wiring layer 3 and a layer provided thereunder, and 6 designates a contact for the wiring layer 4 and a layer provided thereunder.

Figure 12:
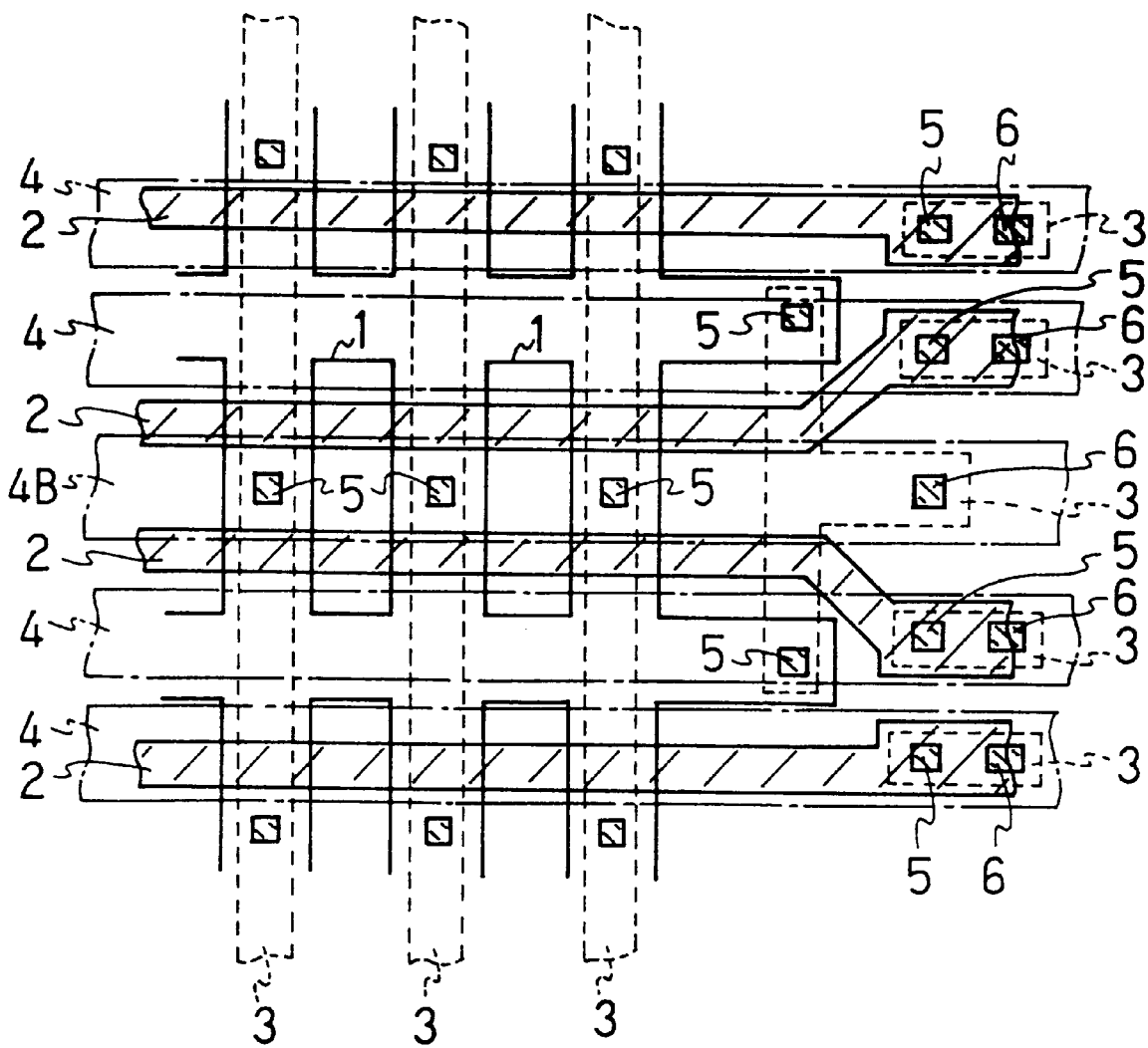
FIG. 12 is a diagram showing the layout of the memory cell array of the semiconductor memory device shown in FIG. 11.
Figure 13:
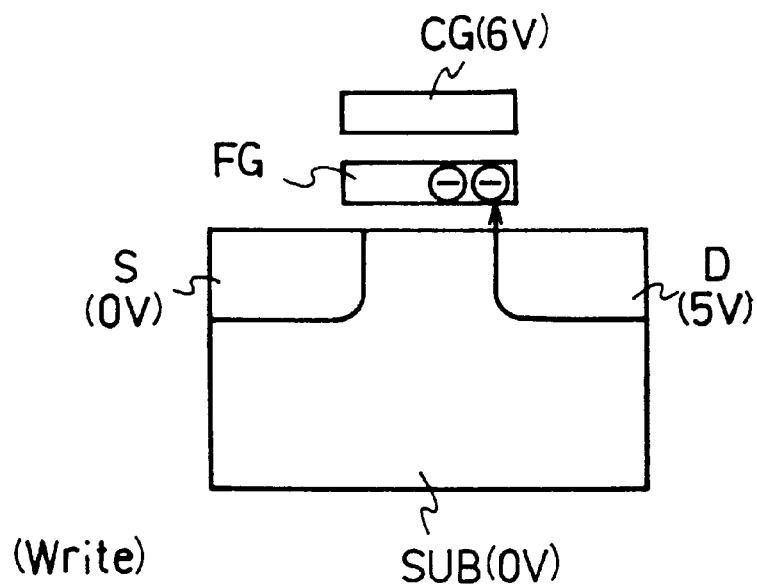
FIG. 13 is a sectional view for explaining the writing operation to a memory cell of a flash memory.
Figure 14:
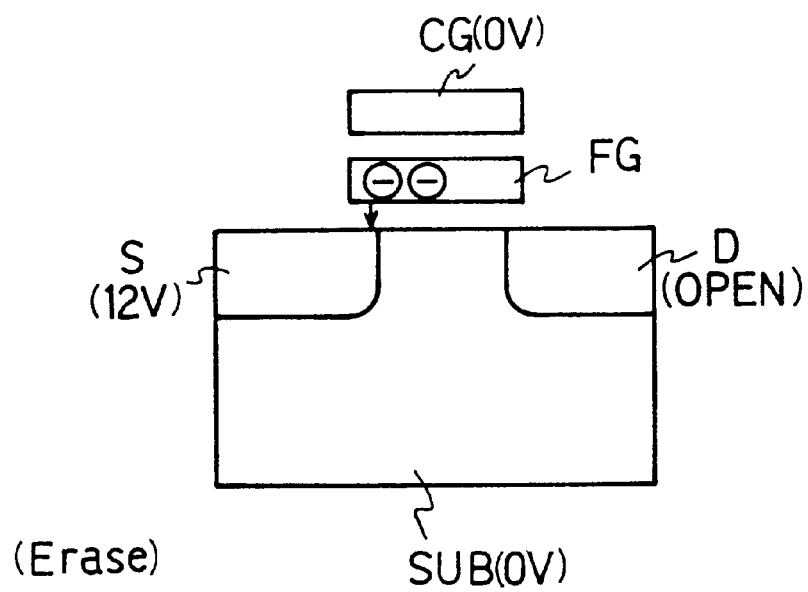
FIG. 14 is a sectional view for explaining the erasing operation of the memory cell of the flash memory.
Figure 15:
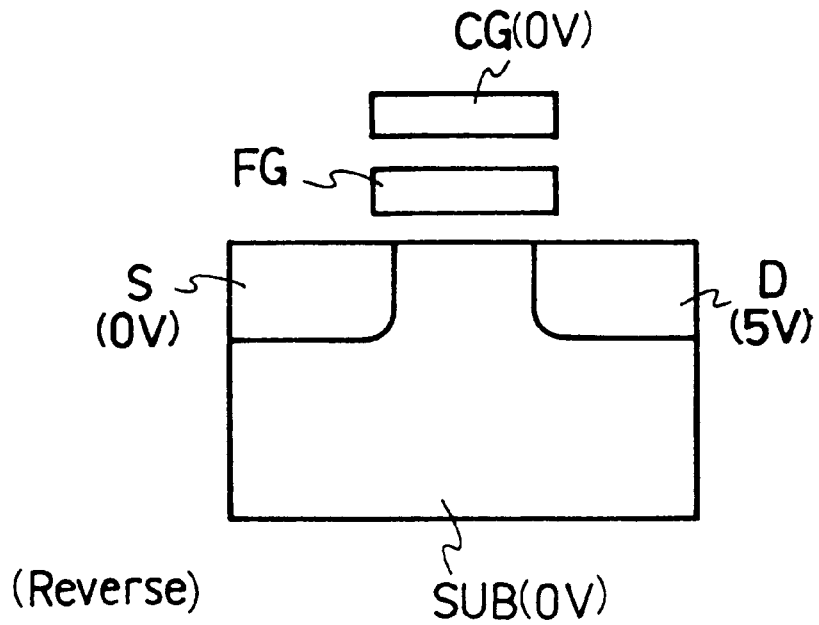
FIG. 15 is a sectional view for explaining the reversal operation of the memory cell of the flash memory.
Figure 16:
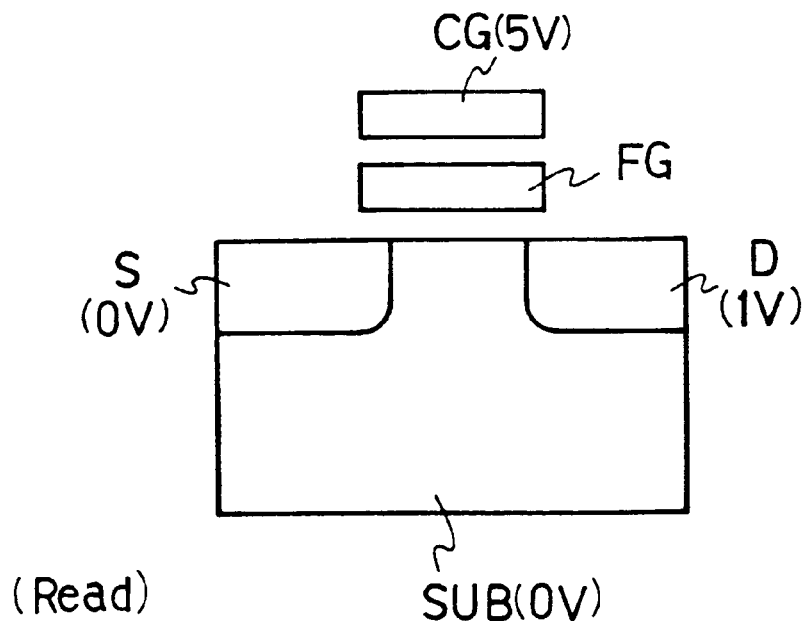
FIG. 16 is a sectional view for explaining the reading operation of the memory cell of the flash memory.
Figure 17:
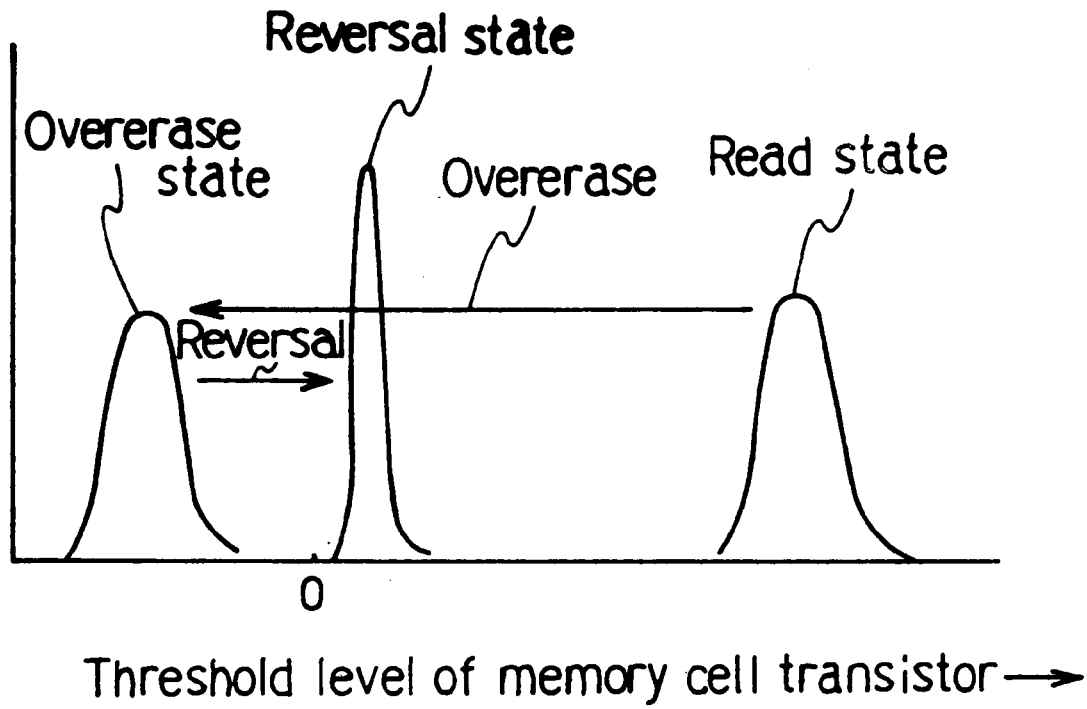
FIG. 17 is a chart showing the threshold of a memory cell transistor for each operation of the flash memory.
Figure 18:
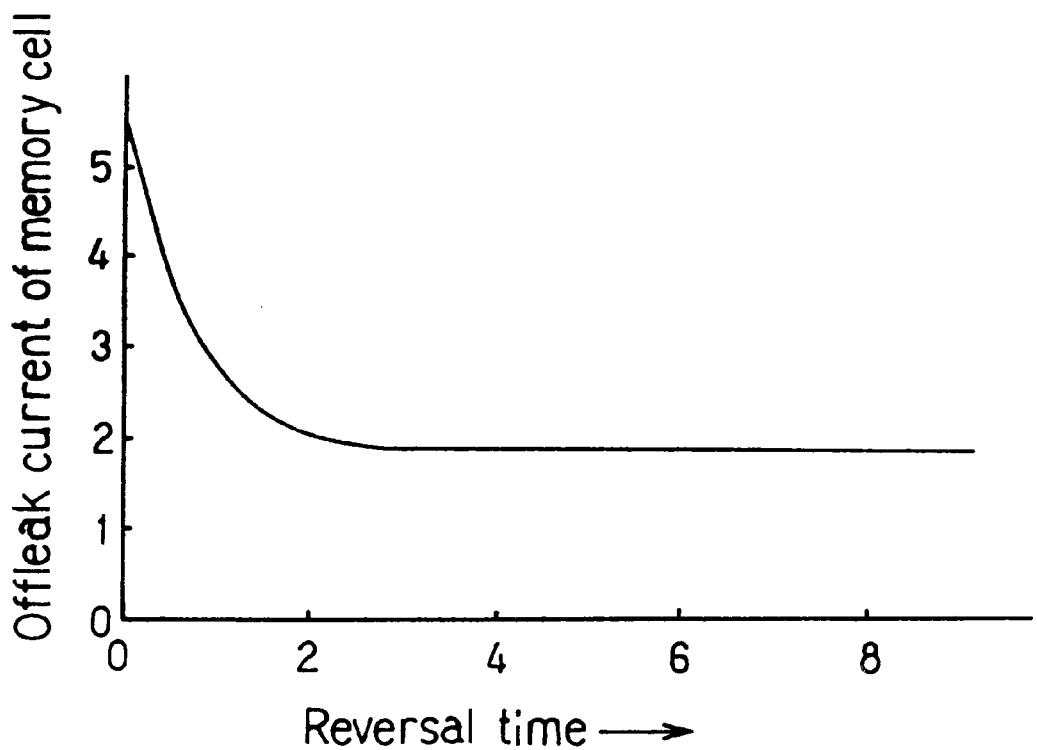
FIG. 18 is a chart showing the relationship between the time for the reversal operation and the offleak current of a memory cell of a flash memory according to the prior art.
Figure 19:
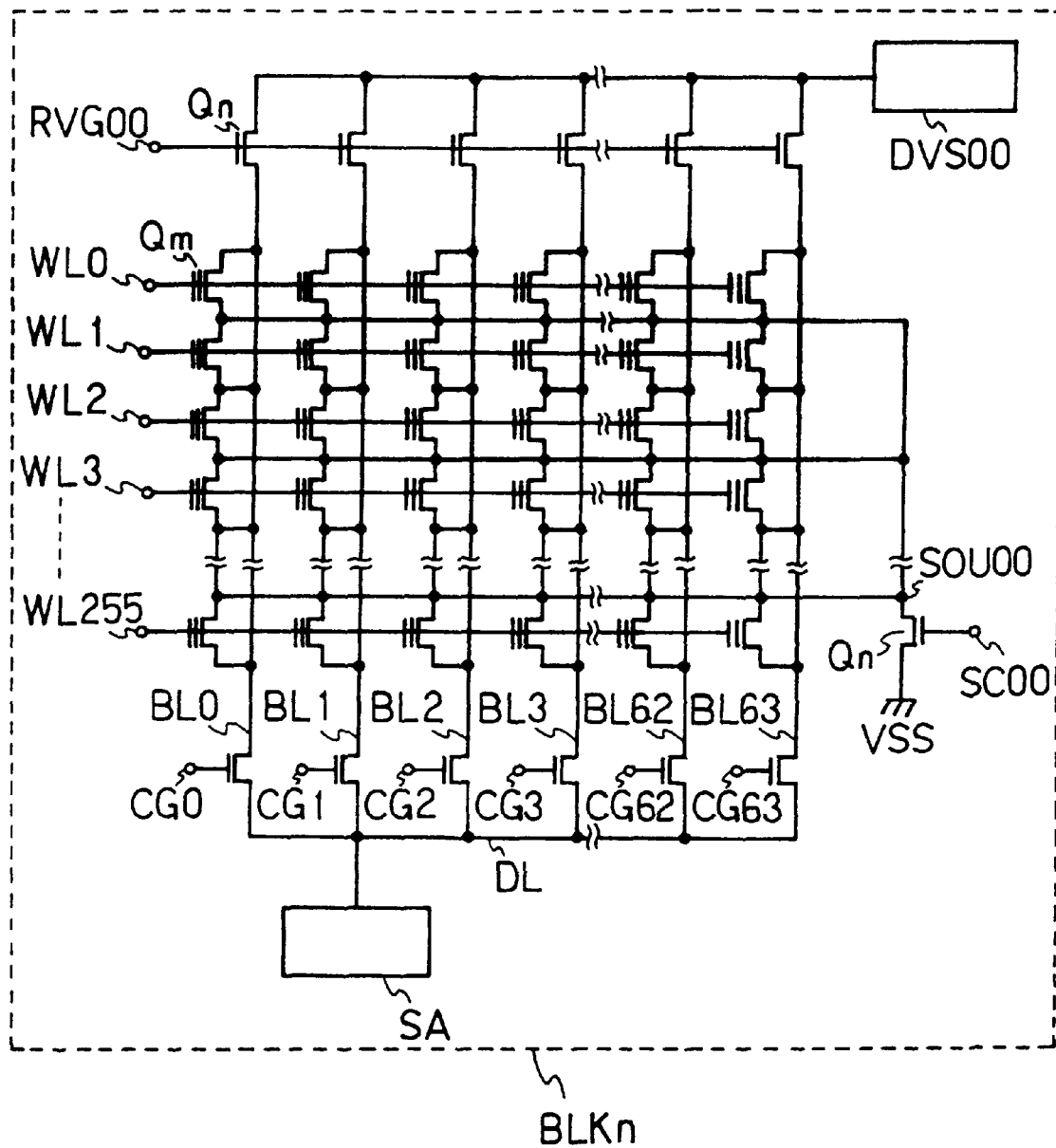
FIG. 19 is a circuit diagram showing a memory cell array of the flash memory according to the prior art.
Figure 20:
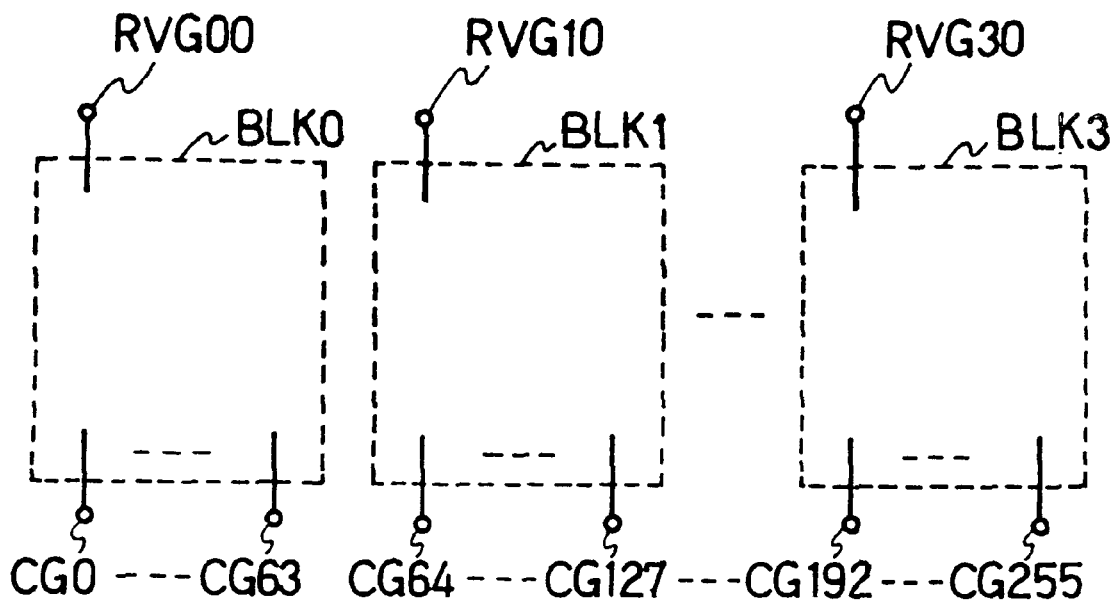
FIG. 20 is a block diagram showing the structure of the memory cell array of the flash memory according to the prior art.
Figure 21:
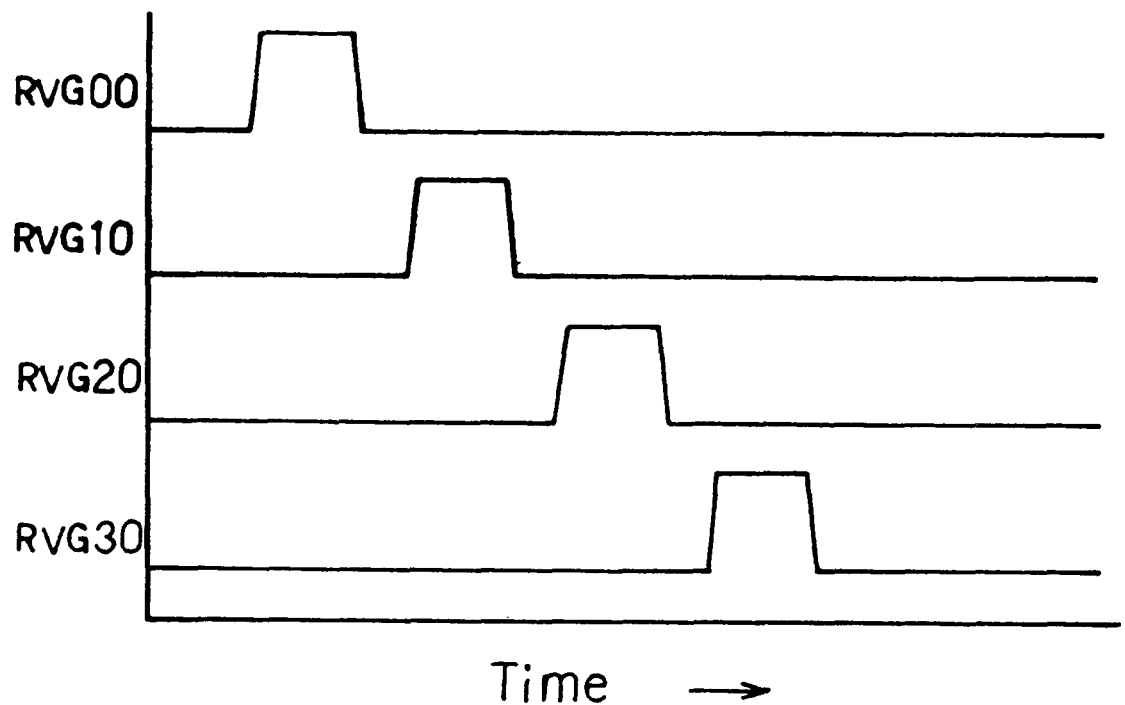
FIG. 21 is a chart showing the operation timing of the flash memory according to the prior art.

In the fifth embodiment, the sources of word lines WL0 to WL3 are shared. For example, when the low level selection signal R0 is selected at a logical voltage "H", the shared source line is connected to a ground voltage supply VSS. Furthermore, one of the boost selection signals Φ W0 to Φ W3 having a low level is selectively boosted and the word line corresponding thereto is selected. In the layout of FIG. 12, the second aluminum wiring 4 is provided as a backing wiring for the word line 2, which forms the control gate of the memory cell transistor made of polysilicon, for example. By the same wiring layer, the source line is formed. In other words, a source line is formed for four word lines that form the control gate of the memory cell transistor. Five second aluminum wirings are formed for four word lines made of polysilicon.

According to such a structure, the resistance of a signal line can be reduced and the influence of the offleak current of the memory cell on the non-selective word line can be reduced with the smaller layout area. As a result, the operation can be performed with a low voltage at a high speed.

According to the semiconductor memory device of the present invention described above, the driving unit of the reversal operation is varied, for example, in order of the full group reversal operation, the partial group reversal operation, and the bit line reversal operation to implement the high-speed reversal operation that can fully control the offleak current of the memory cell and to realize a low-voltage operation.

The invention may be embodied in other forms without departing from the spirit or essential characteristics thereof. The embodiments disclosed in this application are to be considered in all respects as illustrative and not restrictive. The scope of the invention is indicated by the appended claims rather than by the foregoing description, and all changes which come within the meaning and range of equivalency of the claims are intended to be embraced therein.

What is claimed is:

1. A semiconductor memory device, comprising:

a memory cell array in which a plurality of word lines connected to the gates of flash memory cells, a plurality of bit lines connected to the drains of the flash memory cells, and the sources of the flash memory cells that are shared in the direction of the word line are arranged in a matrix; and a source voltage supply;

wherein a selecting signal corresponds to at least one word line being selected, and the source shared in the direction of the word line and the source voltage supply are selectively connected by the selecting signal.

2. The semiconductor memory device as defined in claim 1, wherein the selecting signal corresponds to a plurality of word lines being selected.

3. The semiconductor memory device as defined in claim 1, wherein the word line includes a first wiring layer which forms the gate of the flash memory cell, and a second wiring layer, the shared source being connected by the second wiring layer.

* * * * *